(12) United States Patent
Gogl et al.

(10) Patent No.: US 7,903,454 B2
(45) Date of Patent: Mar. 8, 2011

(54) INTEGRATED CIRCUIT, MEMORY CELL ARRAY, MEMORY MODULE, AND METHOD OF OPERATING AN INTEGRATED CIRCUIT

(75) Inventors: Dietmar Gogl, Cary, NC (US); Rainer Leuschner, Regensburg (DE); Ulrich Klostermann, Munich (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 130 days.

(21) Appl. No.: 12/114,466

(22) Filed: May 2, 2008

(65) Prior Publication Data

US 2009/0273966 A1     Nov. 5, 2009

(51) Int. Cl.
*G11C 11/00* (2006.01)

(52) U.S. Cl. ............ 365/158; 365/189.16; 365/211; 365/213

(58) Field of Classification Search .............. 365/158, 365/189.16, 211, 213
See application file for complete search history.

(56) References Cited

U.S. PATENT DOCUMENTS

| | | | |
|---|---|---|---|
| 6,418,046 B1 * | 7/2002 | Naji | 365/158 |
| 2005/0232001 A1 * | 10/2005 | Tsuji | 365/158 |
| 2007/0109838 A1 * | 5/2007 | Zheng et al. | 365/158 |
| 2007/0297219 A1 * | 12/2007 | Dittrich et al. | 365/158 |

\* cited by examiner

*Primary Examiner* — Hoai V Ho

(57) ABSTRACT

According to one embodiment of the present invention, an integrated circuit includes a plurality of thermal selectable memory cells, each memory cell being connected to a conductive line, the conductive line having a first portion for applying a heating current, and a second portion for applying a programming current. The integrated circuit is configured such that the heating current and the programming current can be routed respectively to the first and the second portion of the conductive line independently from each other.

18 Claims, 7 Drawing Sheets

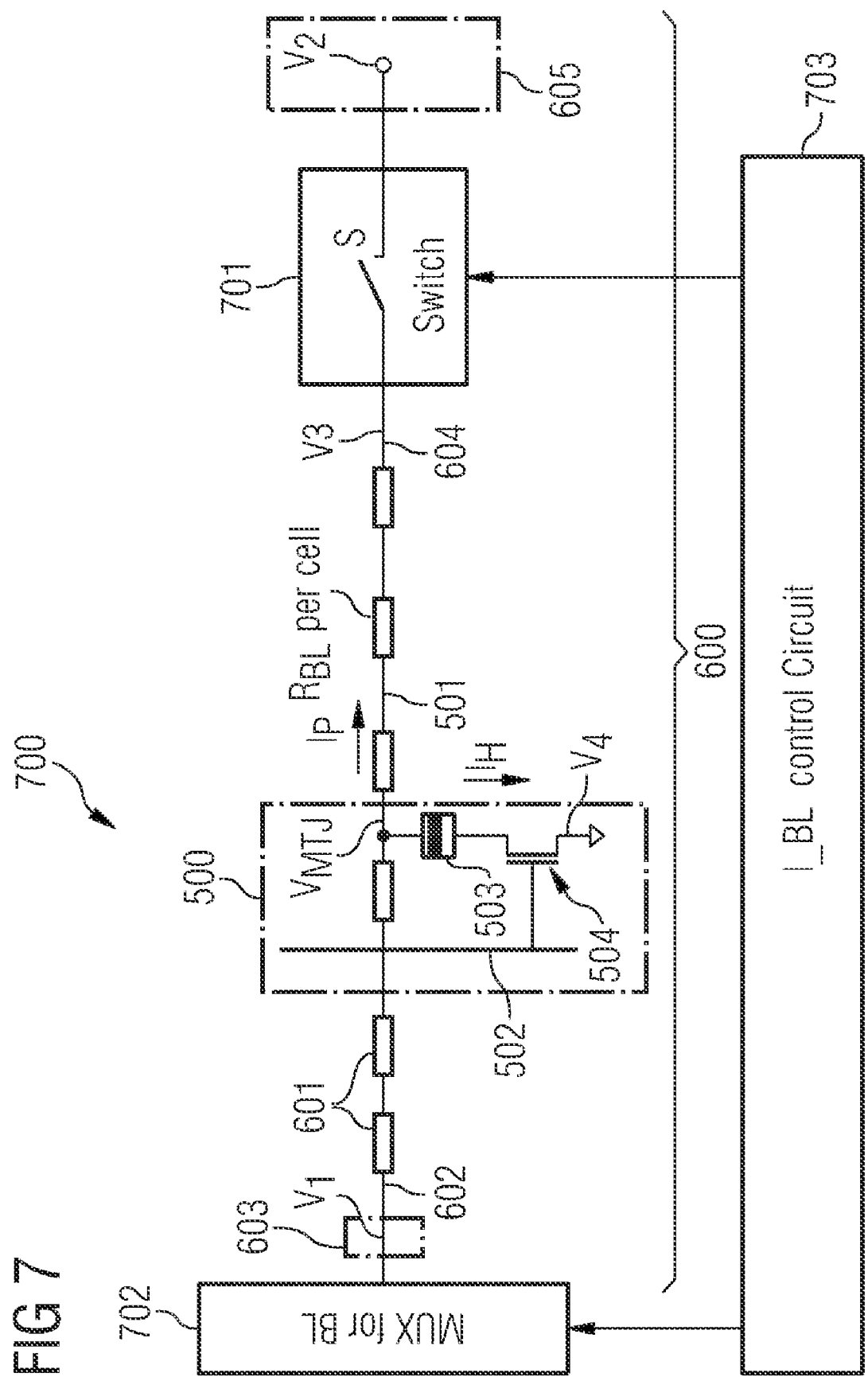

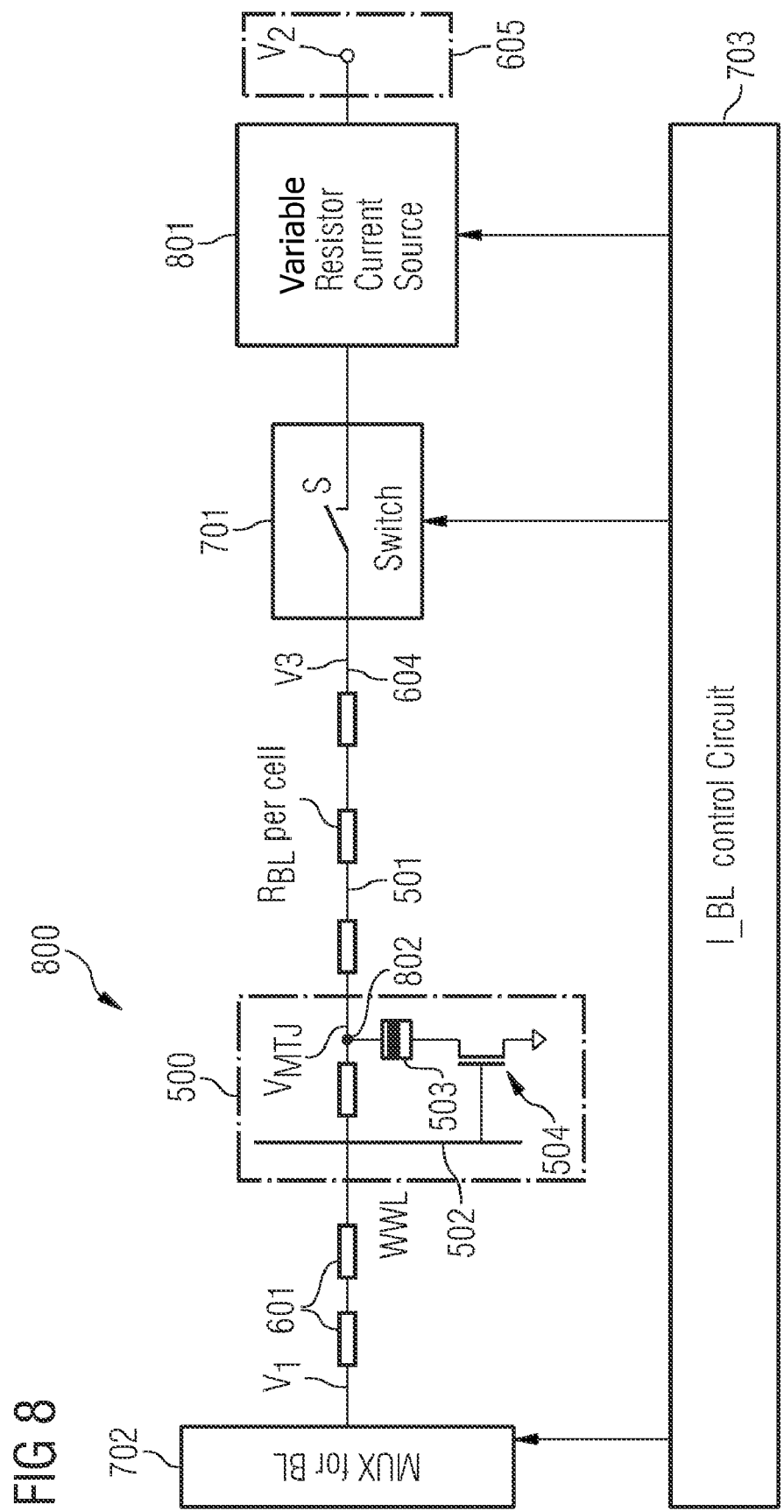

FIG 9

|  | Action | V1 | VMTJ | V3 |
|---|---|---|---|---|
| Heating | Heat | 4 V | 3.6 V | float |
| Programming | Some Heat + H Field | 1 V | 0..1 V | 0 V |

FIG 10

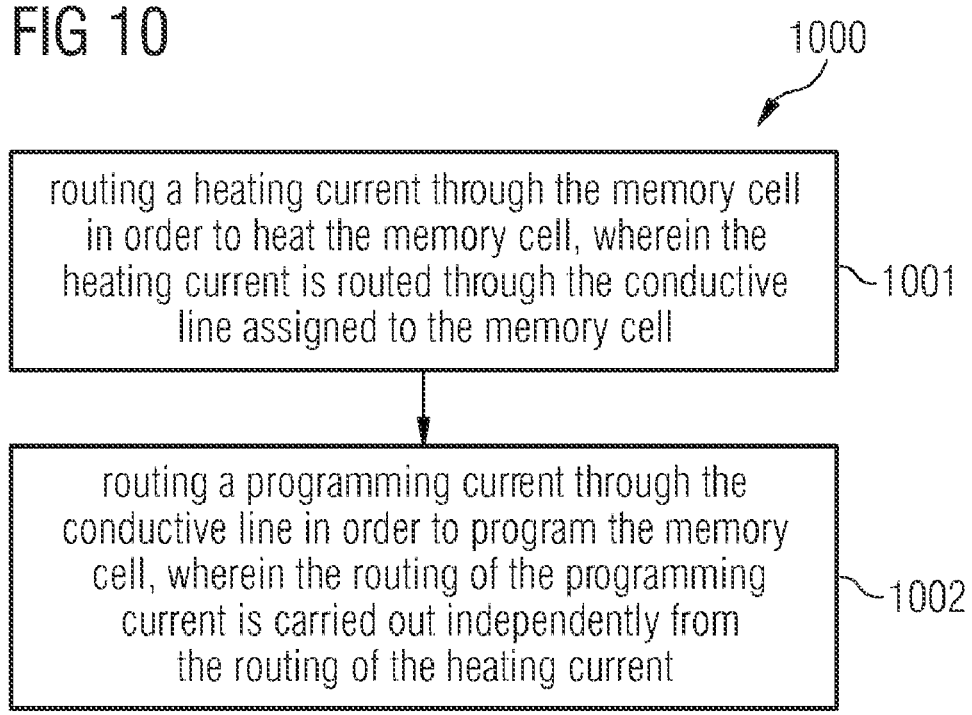

1000 routing a heating current through the memory cell in order to heat the memory cell, wherein the heating current is routed through the conductive line assigned to the memory cell — 1001 routing a programming current through the conductive line in order to program the memory cell, wherein the routing of the programming current is carried out independently from the routing of the heating current — 1002

INTEGRATED CIRCUIT, MEMORY CELL ARRAY, MEMORY MODULE, AND METHOD OF OPERATING AN INTEGRATED CIRCUIT

BACKGROUND

Integrated circuits including resistivity changing memory cells are known. Resistivity changing memory cells may, for example, be magneto-resistive memory cells. Magneto-resistive memory cells involve spin electronics which combines semiconductor technology and magnetics. The spin of an electron, rather than the charge, is used to indicate the presence of a "1" or "0". One such spin electronic device is a magnetic random-access memory (MRAM) which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can also partially turn the magnetic polarity. Digital information, represented as a "0" or "1", is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure or array having rows and columns.

As an example of an integrated circuit having magneto-resistive memory cells, FIG. 1 illustrates a perspective view of a part of a MRAM chip 110 having bit lines 112 located orthogonal to word lines 114 in adjacent metallization layers. Magnetic stacks 116 are positioned between the bit lines 112 and word lines 114 adjacent and electrically coupled to bit lines 112 and word lines 114. Magnetic stacks 116 preferably include multiple layers, including a soft layer 118, a tunnel layer 120, and a hard layer 122, for example. Soft layer 118 and hard layer 122 preferably include a plurality of magnetic metal layers, for example, eight to twelve layers of materials such as PtMn, CoFe, Ru, and NiFe, as examples. A logic state is storable in the soft layer 118 of the magnetic stacks 116 located at the junction of the bit lines 112 and word lines 114 by running a current in the appropriate direction within the bit lines 112 and word lines 114 which changes the resistance of the magnetic stacks 116.

In order to read the logic state stored in the soft layer 118 of a selected magnetic stack 116, a schematic such as the one shown in FIG. 2, including a sense amplifier (SA) 230, is used. A reference voltage $U_R$ is applied to one end of the selected magnetic stack 116. The other end of the selected magnetic stack 116 is coupled to a measurement resistor $R_{m1}$. The other end of the measurement resistor $R_{m1}$ is coupled to ground. The current running through the selected magnetic stack 116 is equal to current $I_{cell}$. A reference circuit 232 supplies a reference current $I_{ref}$ that is run into measurement resistor $R_{m2}$. The other end of the measurement resistor $R_{m2}$ is coupled to ground, as shown.

It is desirable to improve the reliability of semiconductor devices as described above during operation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a schematic drawing of a part of an integrated circuit having magneto-resistive memory cells according to one embodiment of the present invention;

FIG. 8 shows a schematic drawing of a part of an integrated circuit having magneto-resistive memory cells according to one embodiment of the present invention;

FIG. 9 shows examples of voltages which may be used when operating integrated circuits according to embodiments of the present invention;

FIG. 10 shows a method of operating an integrated circuit according to one embodiment of the present invention;

DETAILED DESCRIPTION OF ILLUSTRATIVE EMBODIMENTS

Figure 1:
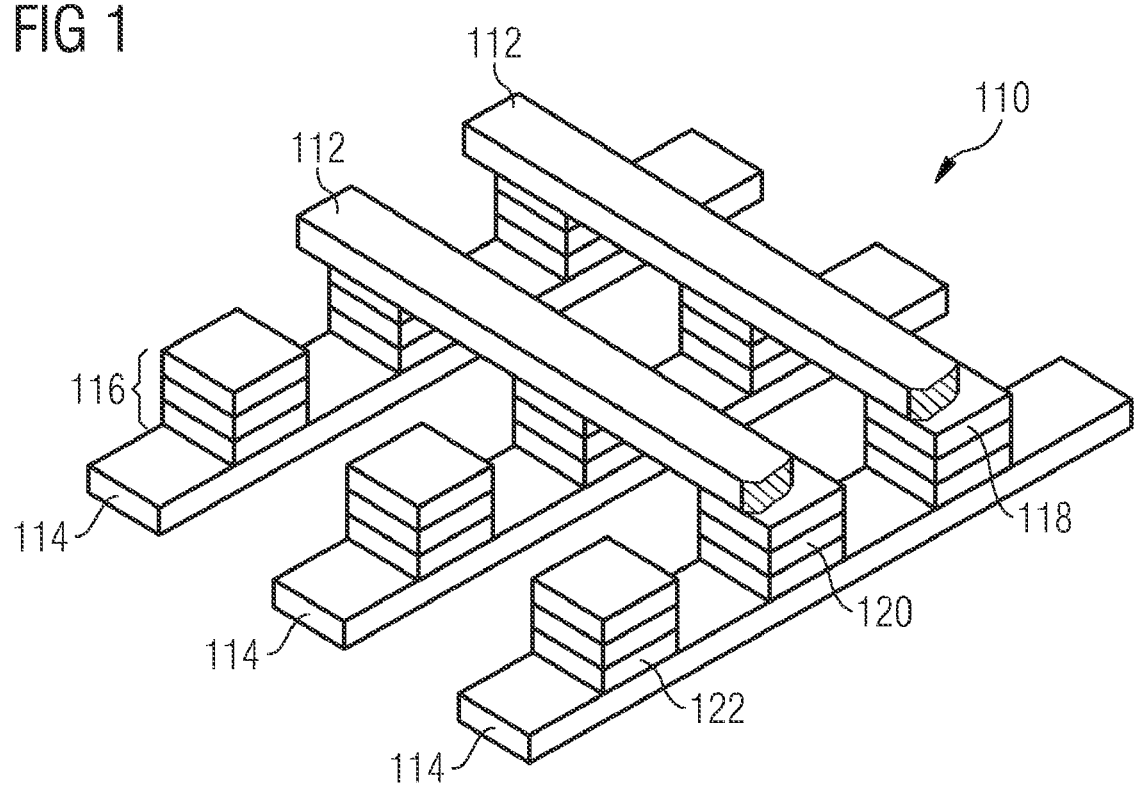
FIG. 1 shows a perspective view of an integrated circuit having magneto-resistive memory cells.
Figure 2:
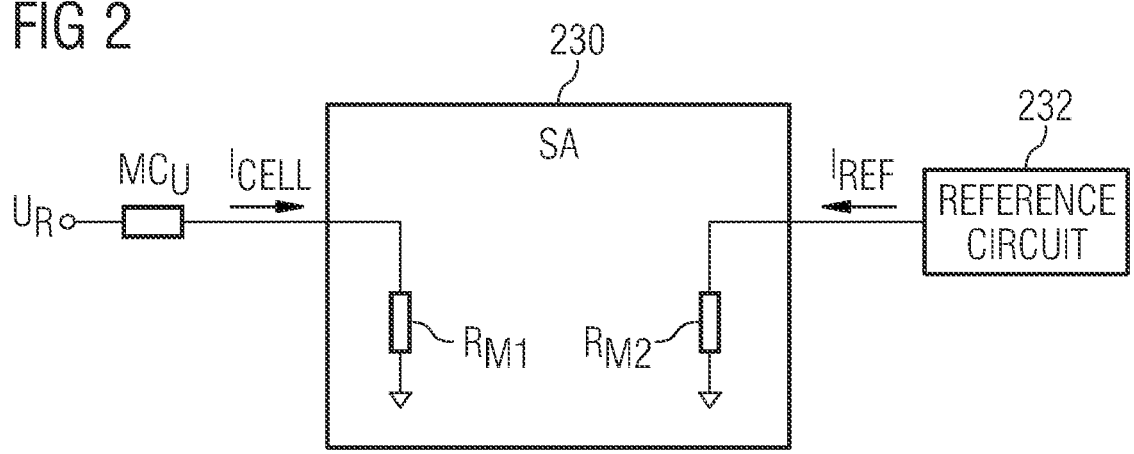
FIG. 2 shows a circuit usable in conjunction with the integrated circuit shown in FIG. 1.
Figure 3:
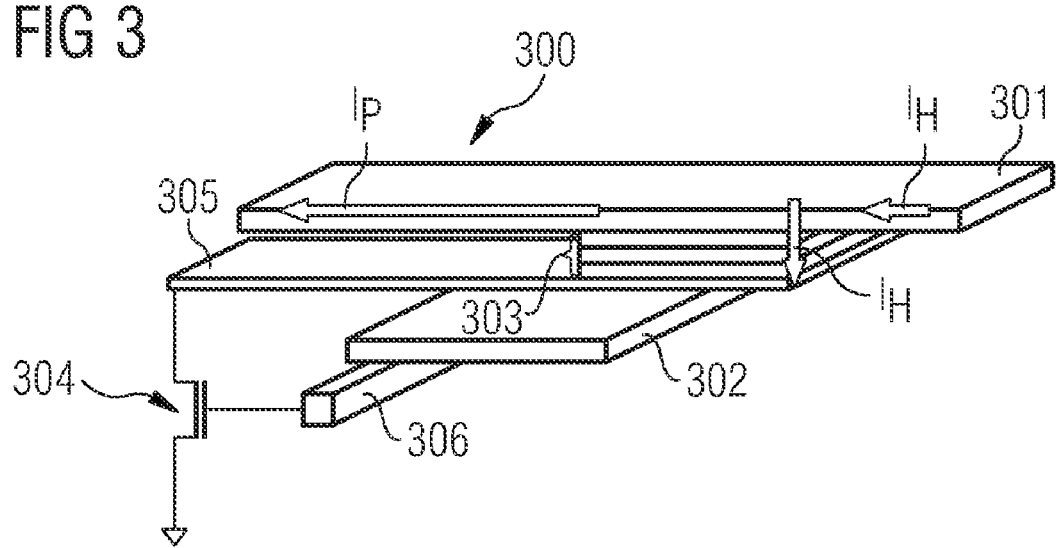
FIG. 3 shows a schematic perspective view of a part of an integrated circuit having magneto-resistive memory cells according to one embodiment of the present invention.

FIG. 3 shows a part of an integrated circuit 300 according to one embodiment of the present invention which includes a bit line 301, a word line 302, a magneto-resistive memory element (e.g., a MTJ (magnetic tunneling junction) element) 303 and a select device 304. The magneto-resistive memory element 303 is connected to the select device 304 via a first connection 305, whereas the word line 302 is connected to the select device 304 via a second connection 306.

In order to program the memory state of the magneto-resistive memory element 303, the magneto-resistive memory element 303 is selected by activating the select device 304 via the word line 302. Then, a heating current $I_H$ is routed through the magneto-resistive memory element 303 via the bit line 301. The heating current $I_H$ heats the magneto-resistive memory element 303 above a temperature threshold value. After having done this, a programming current $I_P$ is routed through the bit line 301, wherein the magnetic field caused by the programming current $I_P$ programs the magnetization of the magneto-resistive memory element 303, thereby storing information within the magneto-resistive memory element 303.

Figure 4:
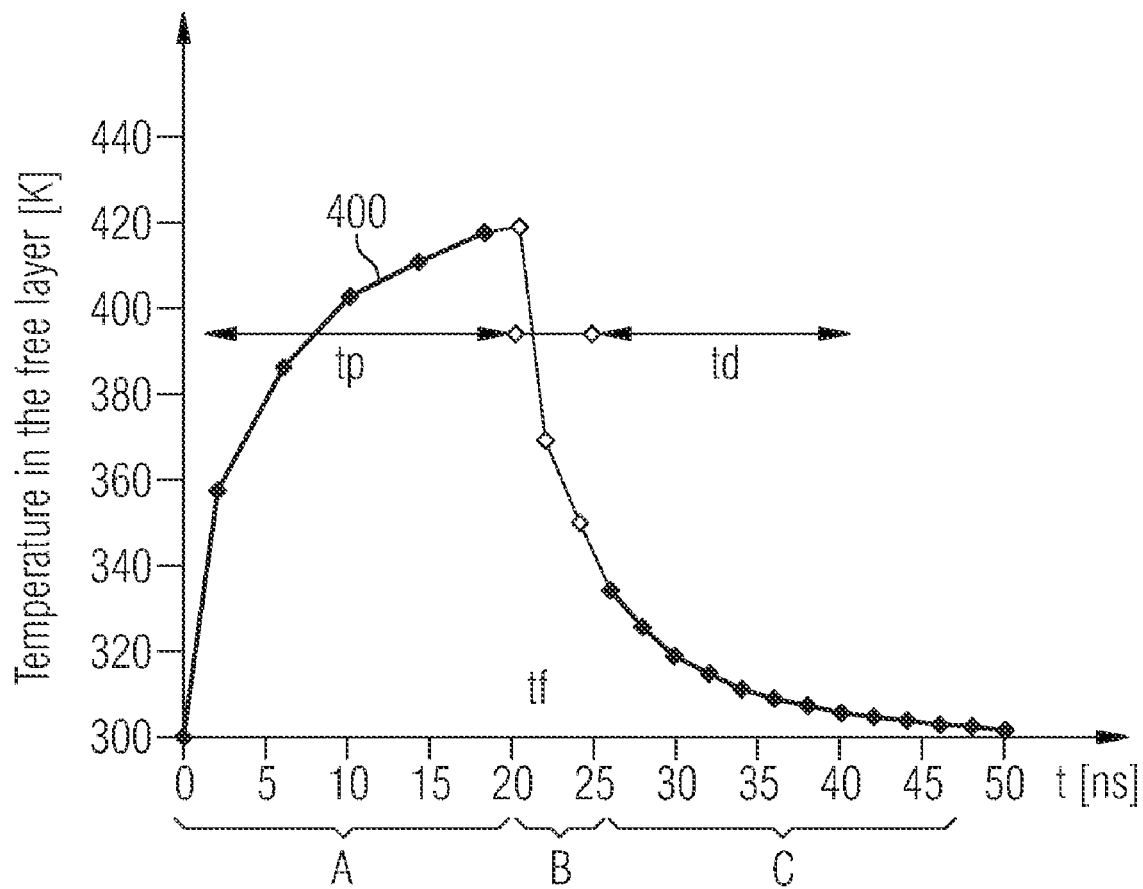
FIG. 4 shows the temperature profile during a programming process of a magneto-resistive memory cell.

FIG. 4 shows the temperature of the magneto-resistive memory element 303 during the programming process described above. As can be derived from FIG. 4, the temperature 400 increases during period A during which the heating current $I_H$ is routed through the magneto-resistive memory element 303. As soon as the heating process is terminated, i.e., as soon as the routing of the heating current $I_H$ through the magneto-resistive memory element 303 is terminated (or at least significantly reduced), the temperature rapidly falls during period B. Then, during period C, the temperature slightly falls until the temperature at the starting point of period A is reached again. The programming of the magneto-resistive memory element 303 has to be carried out within the beginning of period B since within period C the temperature already is to low. However, period B is relatively short (in this embodiment, period B lasts only about 5 ns).

Figure 5:
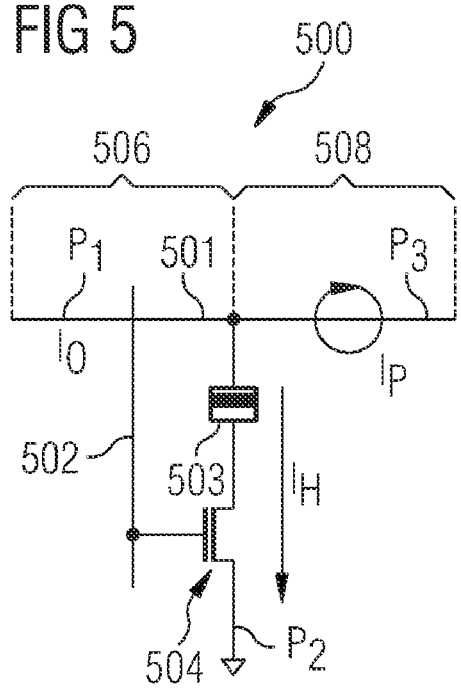
FIG. 5 shows a schematic drawing of a part of an integrated circuit having magneto-resistive memory cells according to one embodiment of the present invention.

FIG. 5 shows a part of an integrated circuit 500 according to one embodiment of the present invention. The integrated circuit 500 includes a first conductive line 501, a second conductive line 502, a magneto-resistive memory element 503, and a select device 504. The magneto-resistive memory element 503 is a thermal selectable memory element.

The magneto-resistive memory element 503 is connected to the first conductive line 501. The first conductive line 501 forms a part of a memory cell heating current path and a part of a memory cell programming current path. Here, it is assumed that the memory cell heating current path leads from point $P_1$ to point $P_2$, whereas the memory cell programming current path leads from point $P_1$ to point $P_3$. The integrated circuit 500 is configured such that heating currents and programming currents can be routed through the first conductive line 501 independently from each other. In other words, heating currents $I_H$ can be routed to/through portion 506 of the first conductive line 501 independently from programming currents $I_P$ routed to/through portion 508 of the first conductive line 501. For example, the programming current $I_P$ can be routed through the first conductive line 501 at the same time when routing the heating current $I_H$ through the first conductive line 501. Alternatively, the programming current routing period may not or only partially overlap with the programming current routing period. According to one embodiment of the present invention, the potential occurring at point $P_2$ is 0V. It holds that $I_0=I_P+I_H$.

According to one embodiment of the present invention, the first conductive line 501 is a bit line, and the second conductive line 502 is a word line.

According to one embodiment of the present invention, the programming current $I_H$ may, for example, range between 11 mA to 10 mA, whereas the heating current $I_P$ may, for example, range between 30 μA to 300 μA.

Figure 6:
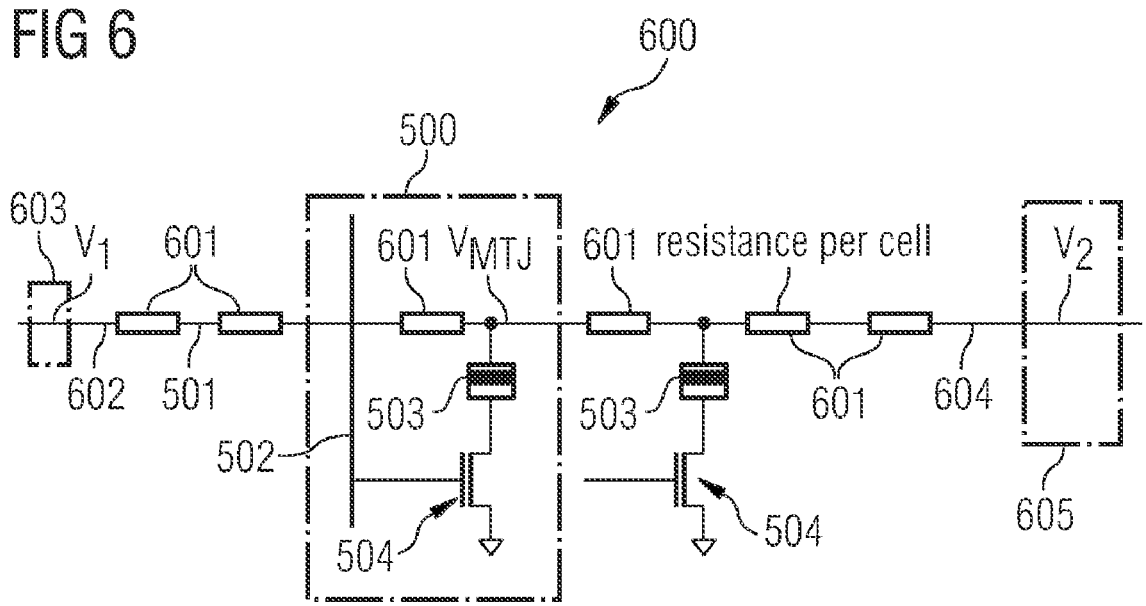
FIG. 6 shows a schematic drawing of a part of an integrated circuit having magneto-resistive memory cells according to one embodiment of the present invention.

FIG. 6 shows an integrated circuit 600 according to one embodiment of the present invention which uses integrated circuit 500 as a memory cell within a memory cell array having memory cell rows and memory cell columns. As can be derived from FIG. 6, the first conductive line 501 is connected to a plurality of magneto-resistive memory elements 503 (only two magneto-resistive memory elements 503 are shown), wherein the resistance of the first conductive line 501 between two neighboring magneto-resistive memory elements 503 is indicated by one of the resistances 601.

According to one embodiment of the present invention, a first end 602 of the first conductive line 501 is connected to a first area 603 set to a first potential $V_1$, and a second end 604 of the first conductive line 501 is connected to a second area 605 set to a second potential $V_2$.

According to one embodiment of the present invention, the first potential $V_1$ and the second potential $V_2$ are fixed potentials, i.e., fixed during the programming process of a magneto-resistive memory element 503. After having terminated the programming process of the magneto-resistive memory element 503, the first potential $V_1$ and the second potential $V_2$ may be changed to other potentials like idle state potentials.

According to one embodiment of the present invention, the second potential $V_2$ is ground potential.

FIG. 7 shows an integrated circuit 700 according to one embodiment of the present invention. The integrated circuit 700 is an example how the integrated circuit 600 may be embodied into a larger context: The integrated circuit 700 includes a switch 701 which connects the second end 604 of the first conductive line 501 to the second area 605 set to the second potential $V_2$. Further, a multiplexer 702 is connected to the first end 602 of the first conductive line 501 (and to several conductive lines which are of the same type as that of the first conductive line 501). The switch 701 and the multiplexer 702 are controlled by a controlling unit 703 (e.g., a controlling circuitry). The controlling unit 703 enables to control the multiplexer 702 and the switch such that heating currents $I_H$ and programming currents $I_P$ can be routed through the first conductive line 501 independently from each other (as will be explained in detail later in conjunction with FIGS. 7 and 8).

According to one embodiment of the present invention, the first area 603 set to the first potential $V_1$ is located within the multiplexer 702.

FIG. 8 shows an integrated circuit 800 according to one embodiment of the present invention. The integrated circuit 800 has the same architecture as the integrated circuit 700 shown in FIG. 7. However, additionally, a potential controlling unit 801 is connected between the second area 605 and the switch 701. The potential controlling unit 801 controls a potential drop between the second area 605 and the second end 604 of the first conductive line 501 such that the potential of the second end 604 is controlled to a third potential $V_3$ (assuming that the switch 701 is closed).

According to one embodiment of the present invention, the third potential $V_3$ is kept fixed during the programming process of the magneto-resistive memory element 503. The third potential $V_3$ can be varied for different magneto-resistive memory elements 503 connected to the first conductive line 501. In this way it can be ensured that, when routing simultaneously a heating current $I_H$ through the magneto-resistive memory element 503 and a programming current $I_P$ through the first conductive line 501, the strength of the sum of the currents $I_H$ and $I_P$ (i.e., the current that flows from the multiplexer through the first conductive line 501 to the junction denoted by reference numeral 802) is the same for each magneto-resistive memory element 503.

According to one embodiment of the present invention, the potential controlling unit 801 is a tunable transistor.

According to one embodiment of the present invention, the potential controlling unit 801 is a transistor current source.

FIG. 10 shows a method 1000 of operating an integrated circuit according to one embodiment of the present invention. At 1001, a heating current is routed through the memory cell in order to heat the memory cell, wherein the heating current is routed through the conductive line assigned to the memory cell. At 1002, a programming current is routed through the conductive line in order to program the memory cell, wherein the routing of the programming current is carried out independently from the routing of the heating current.

In the following description, making reference to FIG. 7, an example will be given how the method shown in FIG. 10 could be realized.

First, the select device 504 is activated by applying a corresponding voltage to the select device 504 via the second conductive line 502 (which may, for example, be a write word line). It is assumed that the switch 701 is opened. The first end 602 of the first conductive line (which may, for example, be a bit line) is set to a first potential $V_1$. Since the select device 504 connects the magneto-resistive memory element 503 to a region set to a fourth potential $V_4$ which is different from the first potential $V_1$, a heating current $I_H$ flows from the first end 602 of the first conductive line 501 through the select device 504, i.e., flows through the magneto-resistive memory element 503. As a consequence, the magneto-resistive memory element 503 (i.e., the free layer of the magneto-resistive memory element 503) is heated. As soon as the temperature of the magneto-resistive memory element 503 exceeds a particular temperature threshold value (which indicates that the magnetization of the magneto-resistive memory element 503 can now be programmed), the switch 701 is closed. Since the second potential $V_2$ to which the second area 605 is set is different from the first potential $V_1$, a programming current $I_P$ flows from the first area 603 to the second area 605. The programming current $I_P$ causes the magneto-resistive memory element 503 to adopt a particular magnetization (magnetization programming). After having programmed the magneto-resistive memory element 503, the switch 701 may be opened again.

Further, the select device 504 may be deactivated by changing the voltage value to which the second conductive line 502 is set. The deactivation of the select device 504 may be carried out immediately after having reached the temperature threshold value. Alternatively, it is possible to deactivate the select device 504 after having applied the programming current $I_P$, e.g., after having opened the switch 701.

According to one embodiment of the present invention, the term "deactivation" of the select device 504 implies that no heating current $I_H$ flows through the magneto-resistive memory element 503 (complete deactivation). Alternatively, this term implies that a heating current $I_H$ still flows through the magneto-resistive memory element 503, which is however reduced in its strength compared to the heating current $I_H$ which flows through the magneto-resistive memory element 503 when the select device 504 is "activated" (in this case, the select device 504 acts as current limiter).

According to one embodiment of the present invention, the programming current $I_P$ and the heating current $I_H$ are routed through the first conductive line 501 simultaneously (at least for a certain period of time), i.e., the switch 701 is closed before deactivating the select device 504. Alternatively, according to one embodiment of the present invention, the programming current $I_P$ is applied after having deactivated the select device 504, i.e., the switch 701 is closed after having deactivated the select device 504. In this case, however, it has to be ensured that the switch 701 is closed at a time instant which guarantees that the programming current $I_P$ is routed through the first conductive line 501 within a period of 1 ns to 5 ns after having terminated the routing of the heating current $I_H$ through the first conductive line 501, i.e., after having deactivated the select device 504. Depending on the architecture of the magneto-resistive memory element 503, this period may also change in its length; for example, if due to a thermal isolation surrounding the magneto-resistive memory element 503 the heat dissipation is lower, the period may be longer.

FIG. 9 shows possible voltages which may be used when carrying out the programming process described above. During the heating process, $V_1$ may, for example, be 4 Volt, $V_{MTJ}$, for example, be 3.6 Volt, and $V_3$ for example be floating (i.e., the switch 701 is opened). During the programming process, $V_1$ may, for example, be 1 Volt, $V_{MTJ}$ may, for example, range between 0 and 1 Volt, and $V_3$ may, for example, be 0 Volt. These voltage values may, for example, occur if $R_{MTJ}$ (resistance through the magneto-resistive memory element 503) is about 1 kOhm, and $R_{FET}$ (resistance through select device element 503) is about 4 kOhm.

According to one embodiment of the present invention, the routing direction of the heating current $I_H$ is chosen in dependence on the memory value (direction of magnetization) to be written into the magneto-resistive memory element 503. That is, the directions of the heating current $I_H$ and the programming current $I_P$ should be the same.

The control of the potentials $V_1$, $V_3$, and $V_{MTJ}$ is done by the controlling circuit 703 using the switch 701 and the multiplexer 702 (the multiplexer 702 selects the desired bit line; it is possible for the multiplexer to select a plurality of bit lines simultaneously).

In the following description, making reference to FIG. 8, a further example will be given how the method shown in FIG. 10 could be realized.

The integrated circuit 800 can be operated in the same way as the integrated circuit 700. In addition, the second end 604 of the first conductive line 501 may be controlled to a third potential $V_3$ during the programming process of the magneto-resistive memory element 503. For example, the third potential $V_3$ may be controlled to a fixed value during the programming process of the magneto-resistive memory element 503.

According to one embodiment of the present invention, the third potential $V_3$ is controlled by controlling the potential drop between the second area 605 and the second end 604 of the first conductive line 501. The third potential $V_3$ may, for example, be controlled using a tunable resister or a transistor current source which are connected between the switch 701 and the second area 605, and which are summarized by the term "potential controlling unit" 801. The potential controlling unit 801 is controlled by the controlling circuit 703. The controlling circuit 703 may, for example, control the multiplexer 702, the switch 701 and the potential controlling unit 801 such that the programming current routed through the first conductive line 501 is the same (e.g., a constant value) regardless which magneto-resistive memory element 503 is programmed, i.e., the third potential $V_3$ to which the second end 604 is controlled during the programming process is individually adapted for each magneto-resistive memory element 503.

According to one embodiment of the present invention, the second potential $V_2$ is set to its value (if the second potential $V_2$ is not mass potential or a comparable potential, this usually takes a certain amount of time) before closing the switch 701 (this may not be necessary in case where the second potential $V_2$ is ground potential which is constant over the time). In this way, it is ensured that, after having closed the switch 701, the second potential $V_2$ is immediately available at the second end 604, i.e., it is not necessary to wait until the second $V_2$ has reached its value (which, as already indicated, always takes a certain amount of time if the potential has to be generated). In this way, the programming speed of the magneto-resistive memory elements 503 can be improved.

According to one embodiment of the present invention, a memory cell array including a plurality of thermal selectable memory cells is provided. Each memory cell is connected to a bit line which forms a part of a memory cell heating current path and a part of a memory cell programming current path. The memory cell array is configured such that heating currents and programming currents can be routed through a bit line independently from each other. For example, each memory cell may have the architecture shown in FIG. 5.

According to one embodiment of the present invention, a memory module including at least one integrated circuit including an arrangement of thermal selectable memory cells is provided. Each memory cell is connected to a conductive line which forms a part of a memory cell heating current path and a path of a memory cell programming current path. The integrated circuit is configured such that heating currents and programming currents can be routed through the conductive line independently from each other.

Figure 11A:
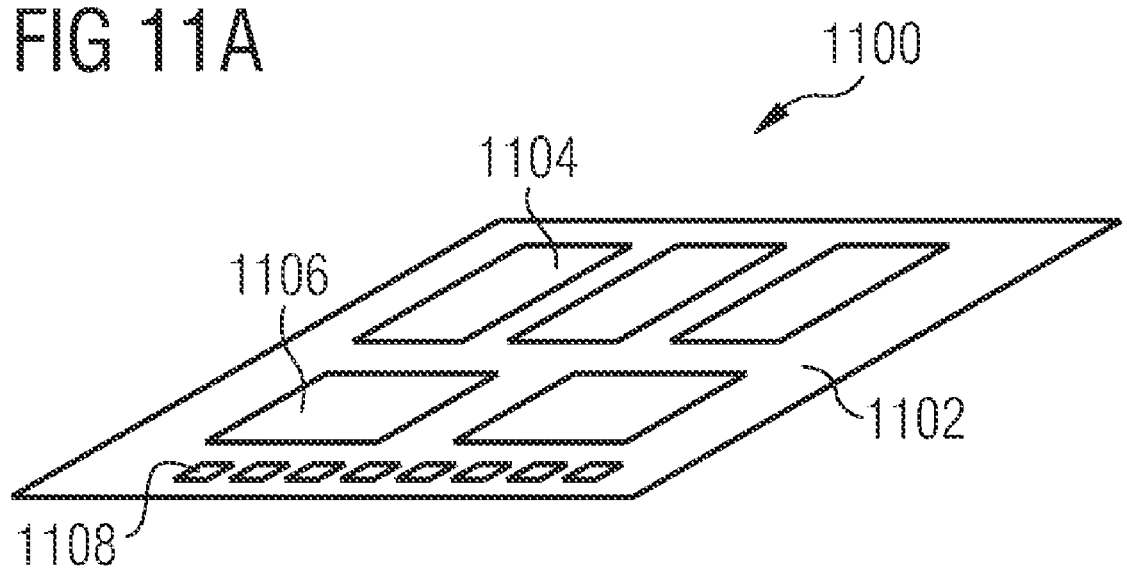
FIG. 11A shows a memory module according to one embodiment of the present invention.
Figure 11B:
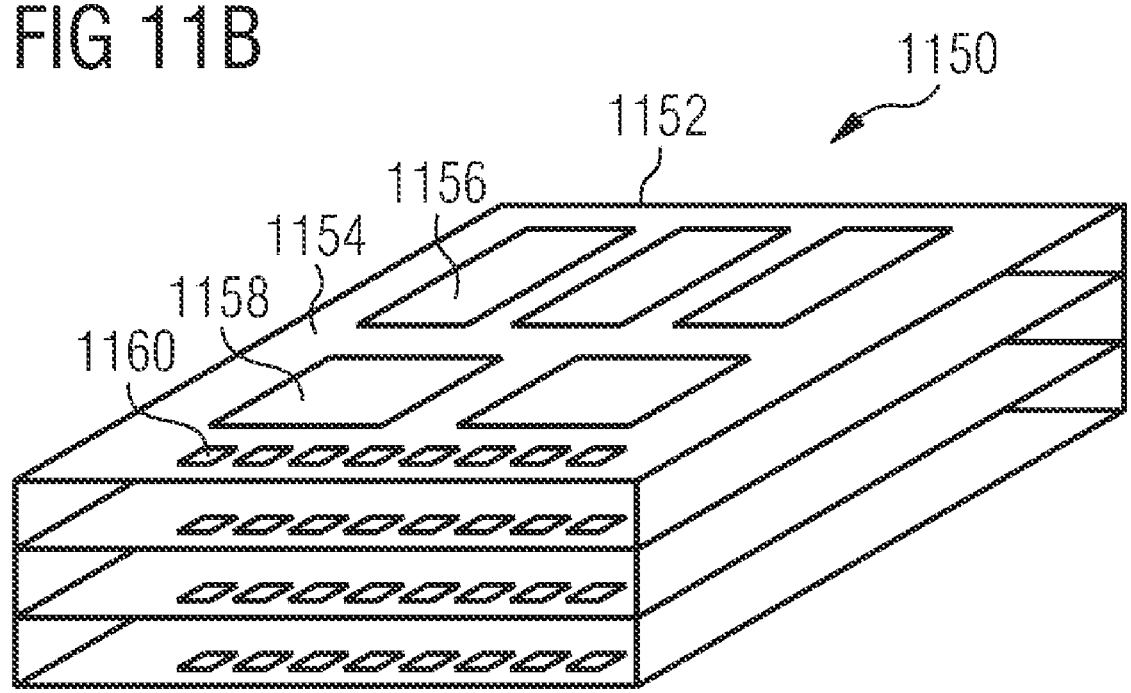
FIG. 11B shows a memory module according to one embodiment of the present invention.

As shown in FIGS. 11A and 11B, in some embodiments, integrated circuits such as those described herein may be used in modules. In FIG. 11A, a memory module 1100 is shown, on which one or more integrated circuits 1104 are arranged on a substrate 1102. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the integrated circuits 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more integrated circuits 1156, arranged on a stackable substrate 1154. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the integrated circuits 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In the following description, further aspects of embodiments of the present invention will be explained.

According to one embodiment of the present invention, the bit line field can be activated instantaneously while still driving current through the MTJ cell.

According to one embodiment of the present invention, since the bit line can be activated before the deactivation of the heating current, the timing can be as fast as possible.

According to one embodiment of the present invention, in the integrated circuit 700 shown in FIG. 7, the potential $V_2$ can be generated using a regulator circuit (not shown).

According to one embodiment of the present invention, $V_3$ can also be adjusted by applying a resistive element like a resistor, MOSFET current source etc. between switch 701 and the second area 605. $V_2$ can than be kept at ground, for example. In order to adjust $V_3$ in this embodiment, any suitable device causing the desired voltage drop: abs $(V_3-V_2)$ is applicable.

In the following description, making reference to FIG. 7, a method of operating the integrated circuit 700 will be given.

In a first process, a desired bit line (first conductive line 501) is activated for heating.

Further, the first potential $V_1$ is applied to the first area 603 in order to heat the magneto-resistive storage element 503 in a later step. $V_1$ may, for example, be positive (~~4 Volt) for "0" writing and negative (~4 V) for "1" writing.

Further, the third potential $V_3$ is kept floating by opening switch 701.

In a second process, it is ensured that the second $V_2$ potential has already been set to a desired voltage for later field generation. In order to do this, the following relation should be fulfilled: [abs $(V_1-V_2)$~voltage drop for BL field generation (~1 Volt)]. The second potential may, for example, be +/−3 Volt.

In a third process, the WL (word line) is activated in order to select the FET (select device) and thus activates the heating flow across the MTJ element.

In a fourth process, the bit line field is set. In order to do so, the first potential $V_1$ is kept at the same potential while keeping the WL activated. Optionally, the first potential $V_1$ will be changed simultaneously while closing switch 701.

Then, the switch 701 is closed; further, the second potential $V_2$ is maintained at its value.

In a fifth process, this situation is maintained for a predetermined amount of time ranging, for example, between 1 ns to 20 ns.

In a sixth process, the WL is deactivated, thus stopping the heating of the MTJ element.

Optionally, in a seventh process, a given period of time is waited to ensure a proper cool down of the MTJ element.

In an eighth process, the bit line is deactivated, the switch 701 is reset, and the first potential $V_1$ and the second potential $V_2$ are set to an idle state (idle state for $V_1/V_2$ could be 0 V or be pre-charged to suitable read voltage for further read operation).

According to one embodiment of the present invention, the select device 504 can be operated in the linear mode and the saturation mode.

According to one embodiment of the present invention, the bit line resistance is in the order of 100 to 200 Ohms per 512 cells.

According to one embodiment of the present invention, the target field current for a bit line is about 5 mA for a 65 nm node.

According to one embodiment of the present invention, the MTJ resistance is about 1 kOhm and about 4 kOhm for an activated field effect transistor.

Thus, according to embodiments of the present invention, the bit lines are used for heat generation and magnetic field generation. A straightforward solution is to drive a current through the MTJ cell up to Tb (blocking temperature), then turn off, and then activate the Bit Line field by running the I_BL current.

One effect of embodiments of the present invention is that the use of additional bit lines or additional word lines can be avoided. Thus, the cell sizes can be reduced.

According to one embodiment of the present invention, a working solution is proposed where the full bit line current is being turned on while the heating current is still heating the cell.

Within the scope of the present invention, the terms "connected" and "coupled" both include direct and indirect coupling/connecting.

According to one embodiment of the present invention, an integrated circuit including an arrangement of thermal selectable memory cells is provided, each memory cell being connected to a conductive line which forms a part of a memory cell heating current path a part of a memory cell programming current path, wherein the integrated circuit is configured such that heating currents and programming currents can be routed through the conductive line independently from each other.

According to one embodiment of the present invention, a first end of the conductive line is connected to a first area set to a first potential, and a second end of the conductive line is connected via a switch to a second area set to a second potential.

According to one embodiment of the present invention, the first potential and the second potential are fixed potentials.

According to one embodiment of the present invention, a potential controlling unit is connected between the second area and the switch, wherein the potential controlling unit controls a potential drop between the second area and the second end of the conductive line such that the potential of the second end of the conductive line is controlled to a third potential.

According to one embodiment of the present invention the third potential is a fixed potential.

According to one embodiment of the present invention, the potential controlling unit is a tunable resistor.

According to one embodiment of the present invention, the potential controlling unit is a transistor current source.

According to one embodiment of the present invention, the second potential is ground potential.

According to one embodiment of the present invention, the conductive line is a bit line or a part of a bit line.

According to one embodiment of the present invention, the first area is located within a bit line multiplexer.

According to one embodiment of the present invention, the bit line multiplexer, the switch and the potential controlling unit are connected to a programming current controlling unit which controls the multiplexer, the switch and the potential controlling unit such that the programming current routed through the bit line is controlled to a constant value.

According to one embodiment of the present invention, a memory cell array including a plurality of thermal selectable memory cells is provided, each memory cell being connected to a bit line which forms a part of a memory cell heating current path and a part of a memory cell programming current path, wherein the memory cell array is configured such that heating currents and programming currents can be routed through a bit line independently from each other.

According to one embodiment of the present invention, a memory module including at least one integrated circuit including an arrangement of thermal selectable memory cells is provided, each memory cell being connected to a conductive line which forms a part of a memory cell heating current path and a part of a memory cell programming current path, wherein the integrated circuit is configured such that heating currents and programming currents can be routed through the conductive line independently from each other.

According to one embodiment of the present invention, a method of operating an integrated circuit including an arrangement of thermal selectable memory cells is provided, each memory cell being connected to a conductive line, the method including: routing a heating current through the memory cell in order to heat the memory cell, wherein the heating current is routed through the conductive line assigned to the memory cell; and routing a programming current through the conductive line in order to program the memory cell, wherein the routing of the programming current is carried out independently from the routing of the heating current.

According to one embodiment of the present invention, the programming current and the heating current are routed through the conductive line simultaneously.

According to one embodiment of the present invention, the routing of the programming current through the conductive line is started immediately after having terminated the routing of the heating current through the conductive line.

According to one embodiment of the present invention, the routing of the programming current through the conductive line is started within 1 ns to 5 ns after having terminated the routing of the heating current through the conductive line.

According to one embodiment of the present invention, the routing direction of the heating current is chosen in dependence on the memory value to be written into the memory cell.

According to one embodiment of the present invention, a first end of the conductive line is connected to a first area set to a first potential, and a second end of the conductive line is connected via a switch to a second area set to a second potential.

According to one embodiment of the present invention, the first and second potentials are fixed potentials.

According to one embodiment of the present invention, in order to route the programming current through the conductive line, the switch is closed.

According to one embodiment of the present invention, the switch is closed during the routing of the heating current through the conductive line.

According to one embodiment of the present invention, the switch is closed immediately after having terminated the routing of the heating current.

According to one embodiment of the present invention, the switch is closed within 1 ns to 5 ns after having terminated the routing of the heating current.

According to one embodiment of the present invention, the potential of the second end of the conductive line is controlled to a third potential by controlling the potential drop between the second area and the second end of the conductive line.

According to one embodiment of the present invention, the potential of the second end of the conductive line is controlled to a fixed potential.

According to one embodiment of the present invention, the potential of the second end of the conductive line is controlled using a tunable resistor.

According to one embodiment of the present invention, the potential of the second end of the conductive line is controlled using a transistor current source.

According to one embodiment of the present invention, the second potential is ground potential.

According to one embodiment of the present invention, the first potential is applied to the first end of the bit line via a bit line multiplexer.

According to one embodiment of the present invention, the bit line multiplexer, the switch and the potential controlling unit are controlled such that the programming current routed through the bit line is controlled to a constant value.

According to one embodiment of the present invention, the second potential is set to its value before closing the switch.

According to one embodiment of the present invention, the first potential is changed in its value before closing the switch.

According to one embodiment of the present invention, the conductive line forms at least a part of a bit line.

According to one embodiment of the present invention, an integrated circuit includes a plurality of thermal selectable memory cells, each memory cell being connected to a conductive line, the conductive line having a first portion for applying a heating current, and a second portion for applying a programming current. The integrated circuit is configured such that the heating current and the programming current can be routed respectively to the first and the second portion of the conductive line independently from each other.

According to one embodiment of the present invention, a memory cell array including a plurality of thermal selectable memory cells is provided, each memory cell being connected to a bit line comprising a first portion for applying a heating current, and a second portion for applying a programming current, the memory cell array being configured such that the heating current and the programming current can be routed respectively to the first and the second portion of the bit line independently from each other.

According to one embodiment of the present invention, a method of operating an integrated circuit including an arrangement of thermal selectable memory cells is provided, each memory cell being connected to a conductive line. The method includes: routing a heating current through the memory cell in order to heat the memory cell, wherein the heating current is routed through a first portion of the conductive line assigned to the memory cell; routing a programming current through a second portion of the conductive line in order to program the memory cell, wherein the routing of the programming current is carried out independently from the routing of the heating current.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a plurality of thermal selectable memory cells, each memory cell being coupled to a conductive line, the conductive line comprising a first portion for applying a heating current, and a second portion for applying a programming current, the integrated circuit being configured such that the heating current and the programming current can be routed respectively to the first and the second portion of the conductive line independently from each other, wherein a first end of the conductive line is coupled to a first area set to a first potential, and wherein a second end of the conductive line is coupled via a switch to a second area set to a second potential, wherein the first potential and the second potential are fixed potentials, further comprising a potential controlling unit is coupled between the second area and the switch, wherein the potential controlling unit controls a potential drop between the second area and the second end of the conductive line such that the potential of the second end of the conductive line is controlled to a third potential.

2. The integrated circuit according to claim 1, wherein the third potential is a fixed potential.

3. The integrated circuit according to claim 1, wherein the potential controlling unit comprises a tunable resistor.

4. The integrated circuit according to claim 1, wherein the potential controlling unit comprises a transistor current source.

5. The integrated circuit according to claim 1, wherein the second potential is a ground potential.

6. An integrated circuit comprising a plurality of thermal selectable memory cells, each memory cell being coupled to a conductive line, the conductive line comprising a first portion for applying a heating current, and a second portion for applying a programming current, the integrated circuit being configured such that the heating current and the programming current can be routed respectively to the first and the second portion of the conductive line independently from each other, wherein the conductive line is a bit line or a part of a bit line, wherein a first end of the conductive line is coupled to a first area set to a first potential, and wherein a second end of the conductive line is coupled via a switch to a second area set to a second potential and wherein the first area is located within a bit line multiplexer, wherein a potential controlling unit is coupled between the second area and the switch, wherein the bit line multiplexer, the switch and the potential controlling unit are coupled to a programming current controlling unit which controls the bit line multiplexer, the switch and the potential controlling unit such that the programming current routed through the bit line is controlled to a constant value.

7. A memory cell array comprising a plurality of thermal selectable memory cells, each memory cell being coupled to a bit line comprising a first portion for applying a heating current, and a second portion for applying a programming current, the memory cell array being configured such that the heating current and the programming current can be routed respectively to the first and the second portion of the bit line independently from each other, wherein a first end of the bit line is coupled to a first area set to a first potential, and wherein a second end of the bit line is coupled via a switch to a second area set to a second potential, wherein the first potential and the second potential are fixed potentials, further comprising a potential controlling unit is coupled between the second area and the switch, wherein the potential controlling unit controls a potential drop between the second area and the second end of the bit line such that the potential of the second end of the bit line is controlled to a third potential.

8. A memory module, the memory module comprising at least one memory cell array according to claim 7.

9. A method of operating an integrated circuit comprising an arrangement of thermal selectable memory cells, each memory cell being coupled to a conductive line, the method comprising:
    routing a heating current through the memory cell in order to heat the memory cell, wherein the heating current is routed through a first portion of the conductive line assigned to the memory cell,
    routing a programming current through a second portion of the conductive line in order to program the memory cell, wherein the routing of the programming current is carried out independently from the routing of the heating current, wherein a first end of the conductive line is coupled to a first area set to a first potential, wherein a second end of the conductive line is coupled via a switch to a second area set to a second potential, wherein the first potential and the second potential are fixed potentials,
    and
    controlling a potential drop between the second area and the second end of the conductive line such that the potential of the second end of the conductive line is controlled to a third potential, wherein the controlling is via a potential controlling unit coupled between the second area and the switch.

10. The method according to claim 9, wherein the programming current and the heating current are routed through the conductive line simultaneously.

11. The method according to claim 9, wherein the routing of the programming current through the conductive line is started immediately after having terminated the routing of the heating current through the conductive line.

12. The method according to claim 9, wherein the routing of the programming current through the conductive line is started within 1 ns to 5 ns after having terminated the routing of the heating current through the conductive line.

13. The method according to claim 9, wherein the routing direction of the heating current is chosen in dependence on a memory value to be written into the memory cell.

14. The method according to claim 9, wherein, in order to route the programming current through the conductive line, the switch is closed.

15. The method according to claim 14, wherein the switch is closed during the routing of the heating current through the conductive line.

16. The method according to claim 14, wherein the switch is closed immediately after having terminated the routing of the heating current.

17. The method according to claim 14, wherein the switch is closed within 1 ns to 5 ns after having terminated the routing of the heating current.

18. A method of operating an integrated circuit comprising an arrangement of thermal selectable memory cells, each memory cell being coupled to a conductive line, the method comprising:

routing a heating current through the memory cell in order to heat the memory cell, wherein the heating current is routed through a first portion of the conductive line assigned to the memory cell, and routing a programming current through a second portion of the conductive line in order to program the memory cell, wherein the routing of the programming current is carried out independently from the routing of the heating current, wherein a first end of the conductive line is coupled to a first area set to a first potential, and wherein a second end of the conductive line is connected via a switch to a second area set to a second potential, wherein the potential of the second end of the conductive line is controlled to a third potential by controlling a potential drop between the second area and the second end of the conductive line.

* * * * *